(12) United States Patent
Paagman

(10) Patent No.: US 6,196,876 B1
(45) Date of Patent: Mar. 6, 2001

(54) ASSEMBLY OF SHIELDED CONNECTORS AND A BOARD HAVING PLATED HOLES

(75) Inventor: Bernardus Paagman, Schijndel (NL)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/613,269

(22) Filed: Jul. 10, 2000

Related U.S. Application Data

(60) Continuation of application No. 09/410,967, filed on Oct. 5, 1999, now abandoned, which is a division of application No. 08/765,772, filed on Jan. 13, 1997, now Pat. No. 5,961,349.

(30) Foreign Application Priority Data

Jul. 15, 1994 (EP) .................................................. 94202072

(51) Int. Cl.[7] .............................................. H01R 13/648
(52) U.S. Cl. ........................................... 439/607; 439/82
(58) Field of Search .................................. 439/607, 608, 439/949, 85, 63, 581

(56) References Cited

U.S. PATENT DOCUMENTS

| | | | |
|---|---|---|---|
| 3,681,744 | 8/1972 | Olsson ..................................... | 439/82 |
| 4,506,939 | 3/1985 | Faulkenberry et al. ............... | 439/63 |
| 4,588,241 | 5/1986 | Ardezzone . | |
| 4,675,788 | 6/1987 | Breitling et al. . | |
| 4,952,896 | 8/1990 | Dawson, Jr. ......................... | 439/607 |
| 5,046,966 | 9/1991 | Snyder et al. ......................... | 439/63 |
| 5,199,879 | 4/1993 | Kohn et al. ............................ | 439/63 |

FOREIGN PATENT DOCUMENTS

| | | |
|---|---|---|
| 2 025 757 | 6/1969 | (DE) . |
| 34 35 749 | 10/1986 | (DE) . |
| 34 35 773 | 10/1986 | (DE) . |
| 44 15 387 A1 | 5/1993 | (DE) . |
| 0 162 474 | 11/1985 | (EP) . |
| 1-164089 | 9/1989 | (JP) . |

OTHER PUBLICATIONS

European Search Report dated Dec. 28, 1994, Application eP 94 20 2072.
IBM Technical Disclosure Bulletin, vol. 16 No. 10, Mar. 1974 Entitled: Annular Ring Coaxial Termination.

*Primary Examiner*—Paula Bradley
*Assistant Examiner*—Tho D. Ta
(74) *Attorney, Agent, or Firm*—Brian J. Hamilla; M. Richard Page

(57) ABSTRACT

Assembly provided with at least one shielded connector (2, 12, 17, 50) and a board (1), each shielded connector being connected to a predetermined side of said board (1) and being provided with at least one signal contact member (3) fitted in a hole (7) of the board (1), the connector having a shielded housing (61) to shield each signal contact member (3), wherein the board (1), except in areas where connectors (2, 12, 17, 50) are fitted to the board (1), is provided with a first continuous electrically conductive layer (9) on one side and a second continuous electrically conductive layer (10) on the opposite side, each of the shielded connector housings being electrically connected to one of said layers (9, 10), in order to prevent electromagnetic radiation generated by any of said signal contact members (3) from propagating to the outside world.

20 Claims, 4 Drawing Sheets

ASSEMBLY OF SHIELDED CONNECTORS AND A BOARD HAVING PLATED HOLES

CROSS-REFERENCE TO RELATED APPLICATIONS

This application is a continuation of U.S. patent application Ser. No. 09/410,967, filed on Oct. 5, 1999, now abandoned, which is a divisional of U.S. patent application Ser. No. 08/765,772, filed on Jan. 13, 1997, now U.S. Pat. No. 5,961,349, both of which are herein incorporated by reference.

1. FIELD OF THE INVENTION

The present invention relates to an assembly comprising at least one connector and a board, each connector being connected to a predetermined side of said board and comprising at least one signal contact member fitted in a hole of the board, the connector comprising electrically conductive connector shielding means to shield each signal contact member.

2. PRIOR ART

Such an assembly is known from U.S. Pat. No. 4,874,319, which is assigned to the Applicant of the present Patent Application and describes a connector-board connection to reduce the adverse effects of electromagnetic radiation generated by signal contact members extending from the connector into the board. The known connector comprises a series of leaf-type spring ground contacts positioned on opposite sides of the signal contact members within the connector. A right-angle connection is present between the connector and the board. To establish this right-angle connection, the signal contact members and the leaf-type spring ground contacts each extend from the rear side of the connector and are bend over 90°. However, the signal contact members extend, unshielded, through corresponding through-holes in the board and are not entirely shielded. When very high frequencies, e.g. within the frequency range from 50 MHz to 15 GHz, are used they still act as antennas radiating undesired electromagnetic radiation.

U.S. Pat. No. 4,697,858 discloses connections between a backplane and several printed circuit boards (pcb's) (FIG. 5). One side of the backplane carries several chip elements each having several terminals. For example as shown in FIG. 7, some of those chip terminals are connected to inner bus lines within the backplane through blind holes reaching as deep as the depth of the corresponding bus lines. Other chip terminals are connected to an inner ground plane through blind holes reaching as deep as the depth of that inner ground plane. Still other signal carrying chip terminals are connected to signal pins extending from the pcb's by means of signal contact members extending entirely through the backplane. These signal contact members extend from connectors accommodating the pcb's and being arranged at the side of the backplane opposite the side carrying the chip elements. None of said connectors is shielded and the signal contact members extend unshielded through said backplane. The bus line within the backplane is situated between two separate ground planes in order to establish a well defined impedance level. No EMC protective measures are provided for.

The present invention starts from the problem that in existing equipment signal contact members of a connector connected to a board, e.g. a pcb or a backplane, extend entirely through plated through-holes and generate electromagnetic radiation also at the opposite side of the board. This will be explained referring to FIG. 1. FIG. 1 shows a connection between a connector 42 and a board 41, e.g. a pcb or a backplane. One signal contact member 43 is schematically shown extending from the connector 42 through a plated through-hole 40. It is to be understood that "signal contact member" is to be conceived as referring to those contact members of the connector 42 that are intended to carry signals during operation, i.e. the not-ground members.

The connector 42 is provided with an electrically conductive layer 47 to shield contact member 43. Therefore, connector 42 is suited as coaxial connector.

In existing connector-board connections each signal contact member 43 extends from the through-hole 40 at the side of the board 41 opposite the connector 42 or at least reaches the other side of the board 41, as shown in FIG. 16 of International Patent Application WO-NL-94/00075 filed on Apr. 12, 1994, by the Applicant of the present Patent Application. Since the end part of the signal contact member 43 extending from the board 41 is not shielded it acts like an antenna and radiates electromagnetic radiation which might induce cross-talk or affect adjacent circuit elements.

SUMMARY OF THE INVENTION

The object of the present invention is to provide an assembly of a board and at least one connector in which each signal contact member of each connector is prevented from radiating any undesired electromagnetic radiation to the outside world.

To reach this object the assembly according to the invention is characterized in that said connector shielding means comprises a shielded connector housing enclosing each contact member, that each hole is provided with an electrically conductive layer on its inside surface, and that the board, except in areas where connectors are fitted to the board, is provided with a first continuous electrically conductive layer on one side and a second continuous electrically conductive disposed in opposed relation to the first electrically conducting layer, each of the shielded connector housings being electrically connected to one of said layers, in order to prevent electromagnetic radiation generated by any of said signal contact members from propagating to the outside world. By the application of these measures all shielding of the individual connectors and the electrically conductive layers on both sides of the board provide a substantially leakproof shield against electromagnetic radiation from the contact members. When the connectors have a coaxial or twinaxial function, such function is retained. By the application of the electrically conductive layer on the inside surface of each hole contact areas for connecting the signal contact members to other circuit elements, e.g. by means of a signal layer within the board, are provided.

Preferably, the board comprises at least one electrically conductive blind hole and at least one signal layer electrically connected to said conductive blind hole, each signal contact member being fitted in a corresponding blind hole.

If required, one of said electrically conductive layers may be covered with an insulating layer, e.g. to protect said layer from engaging other metal parts carrying a certain voltage.

In one embodiment of the assembly according to the invention a first connector is connected to one side of the board and a second connector is connected to the opposite side of said board and one contact member of the first connector is fitted in a first hole and one contact member of the second connector is fitted in a second hole, the first and second holes being aligned with each other. Since connectors may be connected to the board opposite to each other and with aligned contact members package density may be increased.

In such an embodiment, a ground layer may also be provided within the board, separating the first and second holes.

Said first and second holes may be parts of one electrically conductive through-hole in such a way that said contact member of the first connector is electrically connected to said contact member of the second connector.

Each contact member may carry a signal in the frequency range of 50 MHz to 15 GHz. The assembly according to the invention provides excellent shielding against the antenna action of each contact member, even in this range of frequencies.

Each blind hole may have a depth less than 1.5 mm and a diameter less than 1.2 mm. These dimensions may be obtained with current manufacturing methods and allow for the application of blind holes in pcb's which usually have a thickness of about 1.6 mm or more. Moreover, these dimensions stimulate the progress of miniaturization in connector technology which is becoming more and more important but which demands increasing countermeasures against the adverse effects of the antenna action of signal carrying contact members, especially in high frequency applications.

Preferably, each signal contact member is fitted to its corresponding hole by means of a press-fit connection. Such a connection offers great manufacturing advantages. However, alternatively, each signal contact member may be fitted to its corresponding hole by means of a solder connection. As a further alternative, contact members may be fitted into sockets inserted into the holes of the board.

The invention is also directed to a board of an assembly defined above, which board comprises at least said first electrically conductive layer on one side and said second electrically conductive layer disposed in opposed relation to the first electrically conducting layer, said layers being continuous except in areas where connectors are to be fitted, wherein holes for fitting contact members of said connectors are provided in the board within said areas, each hole being provided with an electrically conductive layer on its inside surface.

Other object and further scope of applicability of the present invention will become apparent from the detailed description below, taking in conjunction with the accompanying drawings, in which similar parts are designated by identical reference numbers.

DETAILED DESCRIPTION OF THE PREFERRED EMBODIMENTS

Figure 1:
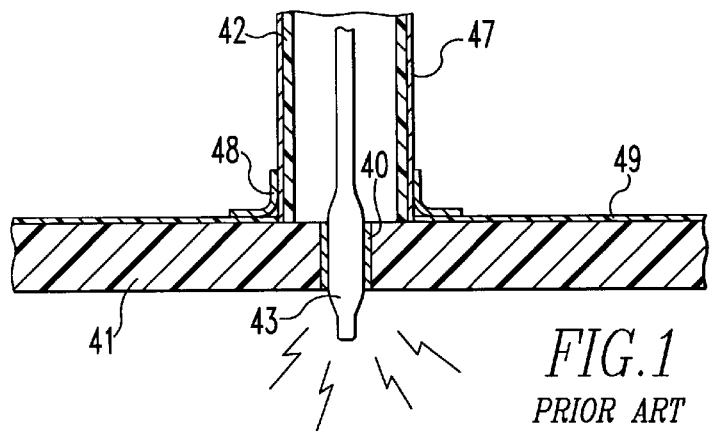
FIG. 1 is an assembly of a typical enhanced connector and a board connected together according to the prior art.
Figure 2:
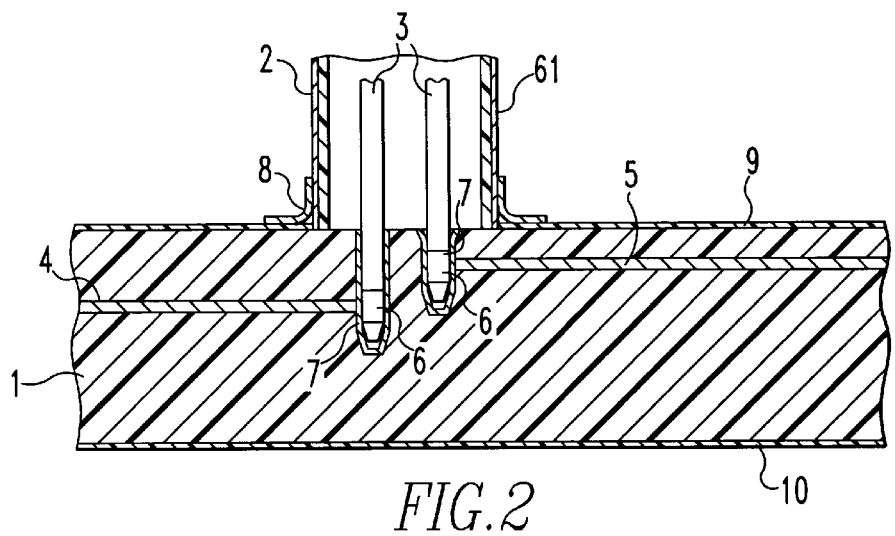
FIG. 2 is an assembly of a connector and a board connected together according to the present invention.

FIG. 2 shows an embodiment of a connection between a connector 2 and a board 1 according to the invention. The connector 2 is provided with an electrically conductive layer 61. The board 1 may be a printed circuit board (pcb), a backplane or any other suitable substrate. Two signal contact members 3 of the connector 2 extend from the connector 2 into a board 1 in corresponding blind holes 7. To prevent any radiation from the signal contact members 3 to reach the outside world, the connector 2 is shielded by appropriate shielding means. As known to a person skilled in the art, this shielding may be obtained by providing a plastic connector coated with a conductive layer which is connected to ground. Alternatively, the connector 2 may comprise a separate metal housing enclosing all signal contact members. The shielding of connector 2 is connected to a ground line or ground plane 9 arranged on the same side of board 1 as the connector 2. The connection between the ground line or ground plane 9 and the conductive layer 61 of connector 2 may be established by appropriate hold down means 8 which are known to persons skilled in the art.

Each of the blind holes 7 are plated with an appropriate metallic coating. Said metallic coating contacts a signal layer 4 and/or 5. By selecting a predetermined distance between the signal layer 4, 5 and the ground plane 9 the impedance of said line 4, 5 can be predetermined, thereby providing the possibility of impedance matching to the connector 2, as is known to persons skilled in the art.

The signal contact members 3 are fitted into the blind holes, e.g. by a press-fit method or by soldering. Each signal contact member 3 may be equipped with additional extensions to enhance electrical contact between each signal contact member and its corresponding blind hole. (This will be explained later by referring to FIG. 5).

A ground plane 10 is arranged on the side of the board 1 opposite to the connector 2.

Since none of the signal contact members 3 extends from the side of the board 1 opposite the connector 2 and that side is covered with the ground plane 10 no disturbing radiation from the signal contact members 3 can be radiated to the area below ground plane 10 (the term "below" is meant to indicate the area at the side of the ground plane 10 opposite the connector 2 and does not pose any limitation as to the scope of the invention).

If required either ground 9 or ground plane 10 or both may be provided with an insulating layer 74 (see FIG. 4a) to prevent undesired short circuits to other electrical components or elements.

Figure 3:
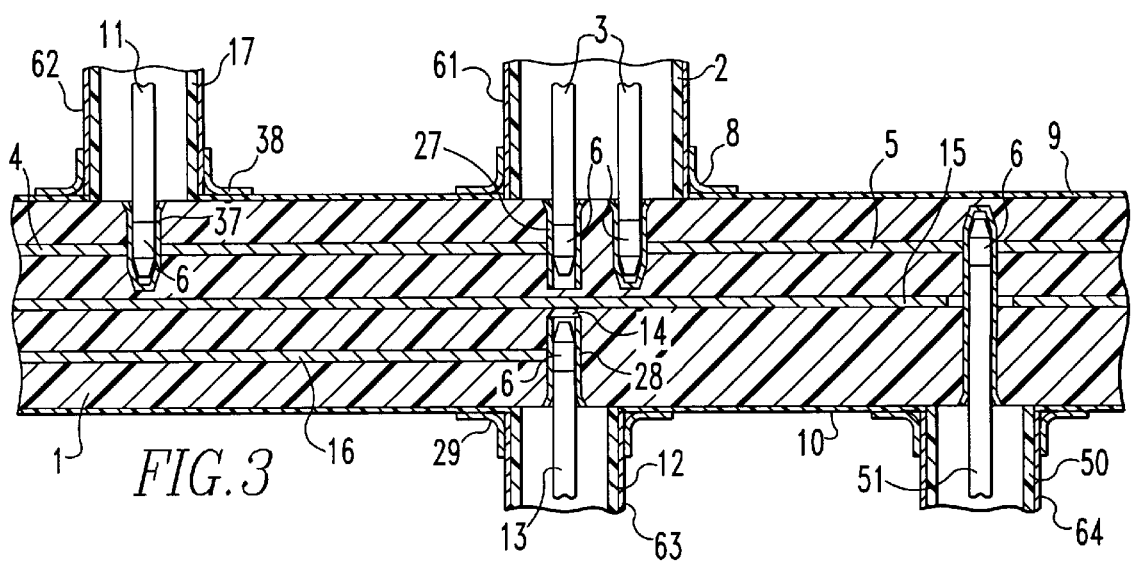
FIG. 3 shows an alternative assembly between some connectors and a board according to the invention.

FIG. 3 shows a further embodiment of an assembly according to the invention. In FIG. 3 the board 1 is connected to four shielded connectors 2, 12, 17, 50. Connector 17 has one signal contact member 11 and is provided with an electrically conductive layer 62. Also connector 12 has one signal contact member 13. It is to be understood that the number of signal contact members shown either in FIG. 2 or FIG. 3 is not meant in a limiting way. FIG. 3 shows that the signal contact member 11 is fitted into a plated blind hole 37 which electrically contacts signal layer 4. Signal layer 4 also electrically contacts plated blind hole 27 receiving one of the signal contact members 3 of connector 2.

Connectors 12 and 50 are connected to the side of board 1 opposite the connectors 2, 17. Connector 12 is connected to the board 1 by the signal contact member 13 which is fitted into a plate blind hole 28 which electrically contacts a signal line 16 within the board 1. Connector 12 comprises an electrically conductive layer 63 which is connected to the ground plane 10 by appropriate hold down means 29. To prevent radiation generated by the signal contact members 3 and 11 to reach the opposite side of the board 1 a further ground plane 15 is arranged within the board 1 separating blind hole 27 in the board 1 from the blind hole 28 in the opposite side of board 1.

Blind holes in one side of the board 1 may be non-aligned with blind holes in the opposite side of board 1. However, as shown in FIG. 3 some of them may be aligned. FIG. 3 shows that blind hole 27 into which one of the signal contact members 3 of connector 2 is fitted is aligned with blind hole 28 in the opposite side of board 1. To prevent cross talk between the signal contact member 3 fitted into blind hole 27 and signal contact member 13 fitted into blind hole 28 further ground plane 15 continuously extends between the end parts of signal contact member 3 and signal contact member 13, respectively, as schematically depicted by reference number 14.

The board 1 with aligned blind holes 27 and 28 may be manufactured by the following steps: forming a subassembly by pressing together under elevated temperature and pressure several board layers (for example 8), each 0.1 mm thick and each being appropriately provided with plated through-holes at predetermined locations—holes of all board layers being aligned at desired locations; pressing the electrically conductive ground plane 15 on said continuous substrate; pressing a further 0.1 mm thick substrate on said electrically conductive ground plane 15; pressing several further board layers (e.g. 8) each 0.1 mm thick and each provided with plated through-holes at predetermined locations—holes of all board layers being aligned—on said further substrate. Other manufacturing methods are possible. Conductive ground plane 15 may, for example, be an insulating, e.g. woven glass fibre resin material FR4, substrate coated with copper or any other metal.

Drilling blind holes in a board 1 is, in principle, also possible. However, the stacking method to produce the multilayer board 1, referred to above is more appropriate since after plating drilled blind holes, in practice, often a conical shape of the plated blind hole having the smallest diameter at the surface of the board will result. This aggravates the ease of insertion of a contact member into such a blind hole. Moreover, such a conical shape of plated blind holes may lead to bad electrical contacts between the plated blind holes and inserted contact members.

FIG. 3 further shows the connector 50 provided with an electrically conductive layer 64, which is connected to ground layer 10 with appropriate hold down means. Connector 50 comprises a contact member 51 extending in a plated blind hole reaching as deep as the conductive layer 5. Contact member 51 is, therefore, electrically connected to conductive layer 5. To prevent a short circuit to ground plane 15 the latter is provided with a through-hole large enough to prevent electrical contact with contact member 51.

It is to be understood that it is also possible to provide one or more plated through-holes through board 1 instead of blind holes which through-holes receive one contact member of a shielded connector at one side of the board and another contact member of another shielded connector at the other side of the board thereby establishing electrical contact between both contact members.

Figure 4:
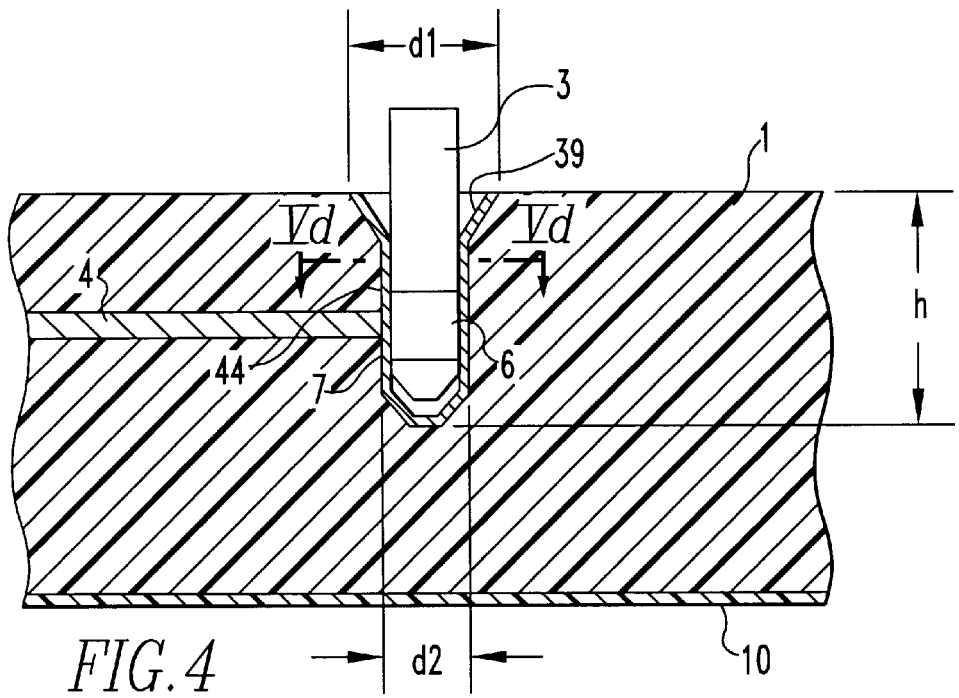
FIG. 4 is an enlarged cross sectional view of a blind hole in a board according to the invention.
Figure 4A:
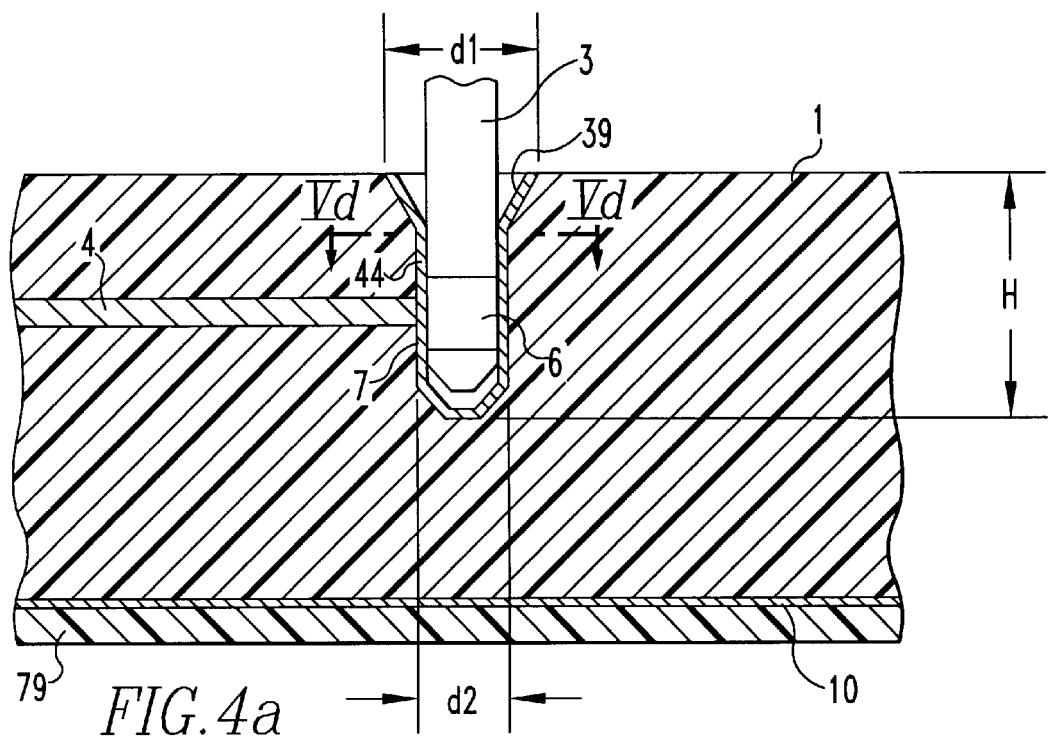
FIG. 4a is an enlarged cross-sectional view of an alternative embodiment of the board having an insulating layer covering a conductive layer.

FIG. 4 shows an enlarged view of a blind hole 7 in a board 1 into which a signal contact member 3 is fitted. The blind hole 7 is plated with an electrically conductive layer 44 which electrically contacts the signal line 4 within the board 1. To ease insertion of the signal contact member 3 into the blind hole 7 the edge 39 of blind hole 7 to the side surface of board 7 is bevelled.

It is to be noted that in FIG. 4 the connector housing 2 and the ground plane 9 are left out for clarity only.

The maximum diameter d1 of blind hole 7 is, preferably, less than 1.5 mm, whereas the diameter d2 of blind hole 7 within the board 1 is preferably less than 1.2 mm and the depth h of blind hole 7 might be less than 1.5 mm. If the depth is smaller than 1.5 mm then two opposite aligned blind holes (like 27, 28 in FIG. 3) in a 3.2 mm thick pcb are possible. Press-fitting in plated through-holes having a diameter of about 0.6 mm in a pcb having a thickness of 1.6 mm has already been proposed in international patent application WO-NL-94/00075, filed Apr. 12, 1994, mentioned above.

Figure 5A:
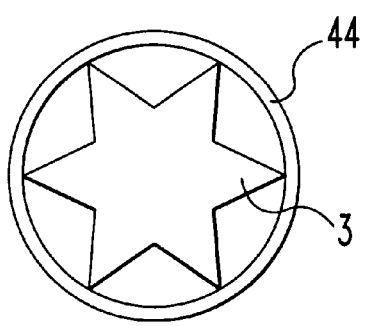
FIGS. 5a to 5d show enlarged views at level V—V in FIG. 4 of possible cross sections of blind holes accommodating press-fit contact members.
Figure 5B:
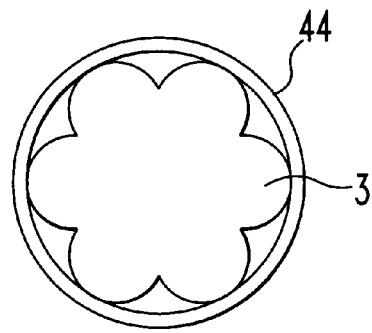
Figure 5C:
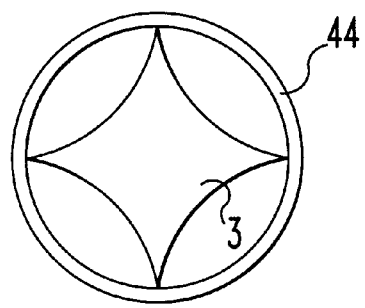
Figure 5D:
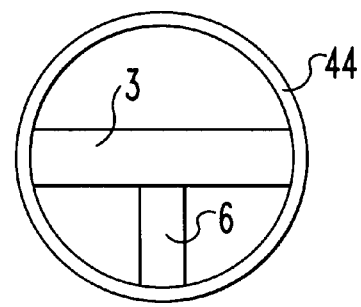

The cross section of a press-fit contact member may have different shapes. FIGS. 5a to 5b show different appropriate shapes of press-fit contact members 3 engaging the electrically conductive coating 44 of the blind hole 7. In FIG. 5d the signal contact member 3 is provided with an extension 6 which is arranged to establish a retention force between the signal contact member 3 and the blind hole 7 when the signal contact member 3 is fitted into the blind hole 7. Further details of such mini press-fit connections are described in international patent application WO-NL-94/00075, mentioned above, and all details as to these retention means 6 are enclosed in the present patent application by reference.

It is to be understood that although all FIGS. 5a to 5d relate to press-fit connections, alternatively, solder connection means are also possible, e.g. the use of additional solder paste which are reflow establishes a permanent soldered connection. However, press-fit is preferred because of the additional ease of reparability. Moreover, the holes need not be plated.

Any other means to manufacture a conductive hole may be used, such as a conductive sleeve or an electrically conductive socket.

Figure 6:
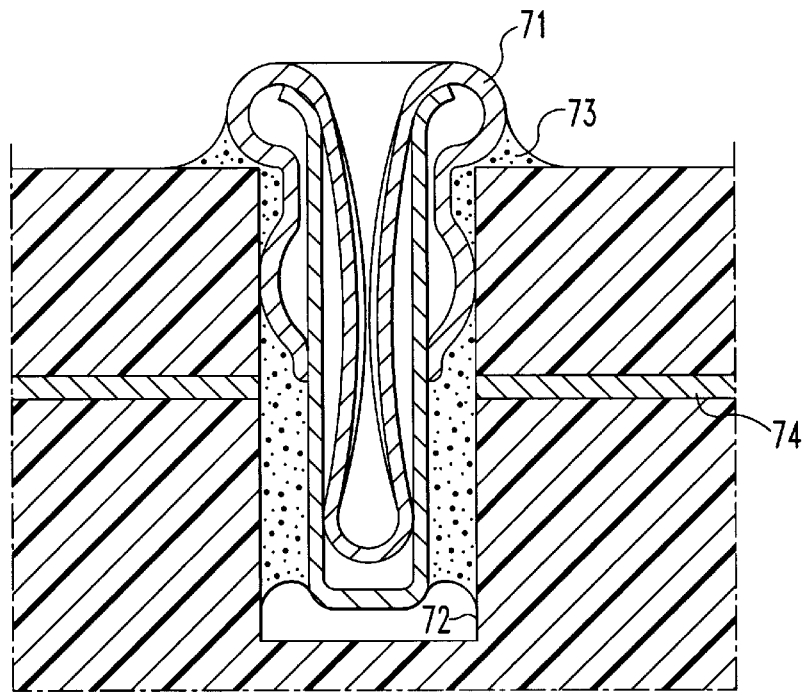
FIGS. 6 and 7 show cross sections of sockets which may be inserted in holes in a board according to the invention.

FIG. 6 schematically shows an enlarged cross-sectional view of a miniature insert socket 71 inserted in a blind hole 72. For further details of insert socket 71, reference is made to U.S. Pat. No. 3,681,738 assigned to Berg Electronics, Inc. All details of insert socket 71 disclosed by U.S. Pat. No. 3,681,738 are included in the present invention by reference. The insert sock 71 may be soldered in the blind hole 72 by solder 73 which improves electrical contact to signal layer 74.

Figure 7:
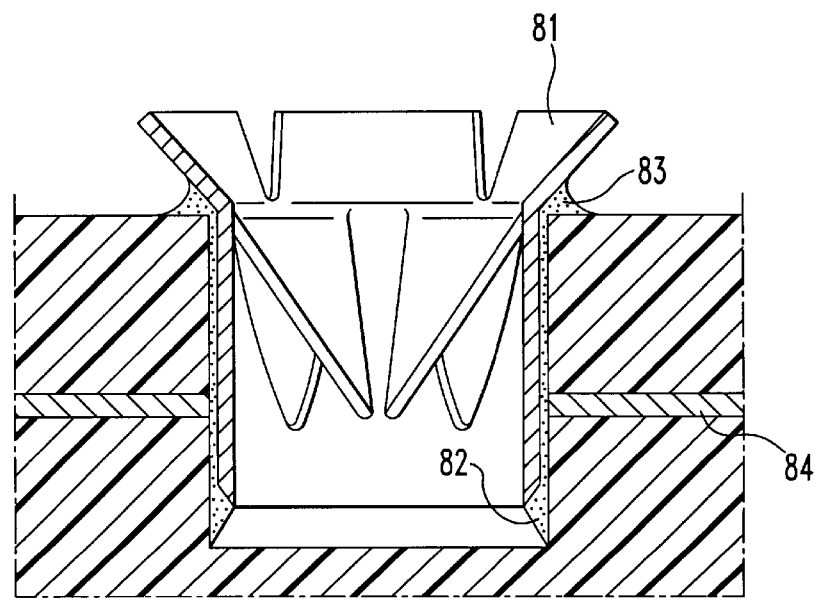

FIG. 7 schematically shows an alternative socket 81 which may be used in the present invention. The socket (or griplet) 81 is inserted into blind hole 82 and may, if desired, be connected to the side wall of blind hole 82 by solder 83. By using solder 83 electrical contact between signal layer 84 and socket 81 is improved. Socket 81 is known as such from U.S. Pat. No. 3,504,328 assigned to Berg Electronics, Inc., the content of which is included in the present invention by reference.

It may be clear to persons skilled in the art that FIGS. 6 and 7 show examples of sockets and holes applicable in the present invention. Other sockets may be used. Moreover, through-holes may be applied instead of blind holes and the application of sockets is not restricted to one signal layer 74, 84 only.

What is claimed is:
1. An assembly, comprising:
   a board, having:

a first side;
an opposed second side;
a first hole; and
a second hole aligned with said first hole, wherein said first and second holes each have an electrically conductive layer on an inside surface;
a first connector on said first side of said board, and having:
at least one first contact member fitted in said first hole; and
a first shielded connector housing enclosing said at least one first contact member; and
a second connector on said second side of said board, and having:
at least one second contact member fitted in said second hole; and
a second shielded connector housing enclosing said at least one second contact member;
wherein said board, except in areas where said first and second connectors are fitted, has a first continuous electrically conductive layer on said first side and a second continuous electrically conductive layer on said second side, and said shielded connector housings are electrically connected to one of said first and second conductive layers in order to prevent electromagnetic radiation generated by said contact members from propagating.

2. The assembly as recited in claim 1, wherein one (10) of said first and second continuous electrically conductive layers is covered with an insulating layer.

3. The assembly as recited in claim 1, further comprising a ground layer (15) within the board (1), said ground layer (15) separating the first (27) and second (28) holes.

4. The assembly as recited in claim 1, wherein the first (27) and second (28) holes are parts of one electrically conductive through-hole in such a way that said first contact member (3) of the first connector (2) is electrically connected to said second contact member (13) of the second connector (12).

5. The assembly as recited in claim 1, wherein each contact member carries a signal in the frequency range of 50 MHz to 15 GHz.

6. The assembly as recited in claim 1, wherein each contact member is press-fitted to its corresponding hole.

7. The assembly as recited in claim 1, wherein each contact member is soldered to its corresponding hole.

8. The assembly as recited in claim 1, wherein at least one of said first hold and second hole (72, 82) has a socket (71, 81) inserted therein.

9. The assembly as recited in claim 1, wherein said first and second holes (7) for fitting said first and second contact members (3) of said first and second connectors are provided in the board (1) within said areas.

10. The assembly as recited in claim 1, wherein the first and second holes are electrically conductive blind holes (7) and at least one signal layer (4, 5) is electrically connected to said conductive blind holes (7), each contact member (3) being fitted in a corresponding blind hole (7).

11. The assembly as recited in claim 10, wherein one (10) of said first and second continuous electrically conductive layers is covered with an insulating layer.

12. The assembly as recited in claim 10, wherein each blind hole has a depth less than 1.5 mm and a diameter less than 1.2 mm.

13. An assembly, comprising:
a first electrical connector, including:
a conductive shield; and
a signal contact capable of producing electromagnetic radiation; and
a circuit substrate, including:
a first side to which said first connector mounts;
a second side;
a blind hole in said first side and having a conductive layer therein for engaging said signal contact of said first connector;
a first shielding layer disposed on said first side except adjacent said blind hole; and
a second shielding layer disposed on said second side;
wherein said conductive shield of said first connector engages said first shielding layer, so that said conductive shield, said first shielding layer and said second shielding layer prevent propogation of said electromagnetic radiation.

14. The assembly as recited in claim 13, wherein said first shielding layer resides on an exterior surface of said circuit substrate.

15. The assembly as recited in claim 13, wherein said first shielding layer resides in an interior of said circuit substrate.

16. The assembly as recited in claim 13, wherein said circuit substrate further comprises a blind hole in said second side, said blind hole including a conductive layer therein.

17. The assembly as recited in claim 16, wherein said blind hole in said second side is aligned with said blind hole in said first side.

18. The assembly as recited in claim 16, further comprising a second electrical connector, including:
a conductive shield secured to said second shielding layer; and
a signal contact engaging said conductive layer in said blind hole of said second side, and capable of producing electromagnetic radiation;
wherein said conductive shield of said second electrical connector, said first shielding layer and said second shielding layer prevent propogation of said electromagnetic radiation.

19. The assembly as recited in claim 18, wherein said circuit substrate further comprises a third shielding layer extending therethrough at a location between said blind hole in said first side and said blind hole in said second side.

20. A circuit substrate, comprising:
an opposed second side;
a first hole on said first side, said first hole having an electrically conductive layer on an inside surface;
a second hole on said second side and aligned with said first hole, said second hole having an electrically conductive layer on an inside surface;
a first shielding conductive layer disposed continuously on said first side, except for an area adjacent said first hole; and
a second shielding layer disposed continuously on said second side, except for an area adjacent said second hole;
wherein said first and second sides are each adapted to receive an electrical connector, each connector having a shielded housing for connecting to a corresponding one of said first and second shielding layers and a signal contact for connecting to said electrically conductive layers in one of said first and second holes, said shielded housings, said first shielding layer and said second shielding layer preventing electromagnetic radiation generated by said signal contacts from propagating.

* * * * *

UNITED STATES PATENT AND TRADEMARK OFFICE
CERTIFICATE OF CORRECTION

PATENT NO. : 6,196,876 B1  Page 1 of 1
DATED : March 6, 2001
INVENTOR(S) : Paagman It is certified that error appears in the above-identified patent and that said Letters Patent is hereby corrected as shown below:

<u>Column 8, claim 20,</u>
Line 42, after "comprising:", a new line should be started and -- a first side; -- inserted.

Signed and Sealed this

Twenty-fifth Day of December, 2001

Attest:

Attesting Officer

JAMES E. ROGAN
*Director of the United States Patent and Trademark Office*